(12) United States Patent
Shimonishi et al.

(10) Patent No.: US 8,643,271 B2
(45) Date of Patent: Feb. 4, 2014

(54) LED LAMP MODULE

(75) Inventors: Shota Shimonishi, Aichi-ken (JP);
Hiroyuki Tajima, Aichi-ken (JP);
Toshimasa Hayashi, Aichi-ken (JP);
Hideki Kokubu, Aichi-ken (JP)

(73) Assignee: Toyoda Gosei Co., Ltd., Aichi-Ken (JP)

( * ) Notice: Subject to any disclaimer, the term of this patent is extended or adjusted under 35 U.S.C. 154(b) by 121 days.

(21) Appl. No.: 12/320,824

(22) Filed: Feb. 5, 2009

(65) Prior Publication Data
US 2009/0206718 A1   Aug. 20, 2009

(30) Foreign Application Priority Data
Feb. 20, 2008   (JP) .................. P2008-039001

(51) Int. Cl.
*H01L 23/02* (2006.01)
(52) U.S. Cl.
USPC .......................................... 313/512; 313/46
(58) Field of Classification Search
USPC ................. 313/46, 498, 499, 511, 512
See application file for complete search history.

(56) References Cited

U.S. PATENT DOCUMENTS

| 5,638,597 | A * | 6/1997 | Cutting et al. ................ 29/830 |
| 6,274,924 | B1 * | 8/2001 | Carey et al. ................ 257/676 |
| 6,392,778 | B1 | 5/2002 | Perdujin et al. |
| 7,296,916 | B2 | 11/2007 | Ouderkirk et al. |
| 7,462,880 | B2 * | 12/2008 | Ishikura et al. ................ 257/99 |
| 7,695,163 | B2 | 4/2010 | Yamada et al. |
| 7,800,124 | B2 | 9/2010 | Urano et al. |
| 2004/0114393 | A1 * | 6/2004 | Galli .......................... 362/555 |
| 2005/0194607 | A1 * | 9/2005 | Barnett et al. ................ 257/99 |
| 2006/0001055 | A1 * | 1/2006 | Ueno et al. .................. 257/257 |
| 2006/0131596 | A1 | 6/2006 | Ouderkirk et al. |
| 2007/0058378 | A1 | 3/2007 | Moriyama et al. |
| 2007/0170450 | A1 * | 7/2007 | Murphy ....................... 257/99 |
| 2009/0026485 | A1 | 1/2009 | Urano et al. |
| 2009/0027887 | A1 | 1/2009 | Yamada et al. |

FOREIGN PATENT DOCUMENTS

| JP | 11-211749 A | 8/1999 |
| JP | 2001-015815 A | 1/2001 |
| JP | 3083557 | 11/2001 |
| JP | 2002-539626 A | 11/2002 |
| JP | 2005-260102 A | 9/2005 |
| JP | 2007-043125 A | 2/2007 |

(Continued)

OTHER PUBLICATIONS

Notification of Reasons for Refusal dated Jun. 19, 2012, with English-language translation.

*Primary Examiner* — Nimeshkumar Patel
*Assistant Examiner* — Christopher Raabe
(74) *Attorney, Agent, or Firm* — McGinn IP Law Group, PLLC

(57) ABSTRACT

The present invention provides a LED lamp module including a metal base, a flexible board mounted on the metal base and having a through hole, a surface mounted type LED lamp including a ceramic package having a projection portion on a back of the ceramic package, a LED chip mounted on the ceramic package, and a light output surface. The projection part is thermally connected with the metal base through the through hole, and the LED lamp is electrically connected with the flexible board through an electric conductive member at a portion other than the projection portion. The LED lamp module includes a cover covering a part of the LED lamp other than the light output surface and the flexible board and pressing the LED lamp.

20 Claims, 3 Drawing Sheets

(56) References Cited

FOREIGN PATENT DOCUMENTS

| | | |
|---|---|---|
| JP | 3130527 | 3/2007 |
| JP | 2007-200727 A | 8/2007 |
| JP | 2007-242772 A | 9/2007 |
| WO | 02/11173 A1 | 2/2002 |
| WO | WO 2005-088191 A1 | 9/2005 |
| WO | WO 2006-068762 A2 | 6/2006 |

* cited by examiner

LED LAMP MODULE

BACKGROUND OF THE INVENTION

This invention relates to an LED (Light Emitting Diode) lamp module provided by thermally connecting a surface-mounted type LED lamp having an LED chip mounted on a ceramic package to a radiator plate.

A surface-mounted type LED lamp having an LED chip mounted on a package is mounted on a wiring board made up of glass epoxy and metal of Cu (copper), Al (aluminum), or the like, through solder, whereby an LED lamp module is provided for use with a lighting system, or the like. (For example, refer to Patent Publication No. 2004-505172) White resin, ceramic, or the like, is used as a material of the package. A package made of white resin discolors because of aged deterioration of the white resin and involves a problem of degradation of the light output efficiency. Thus, often a ceramic package free from aged-deterioration is used for applications when high quality is required.

However, to mount an LED lamp on the above-mentioned wiring board, the thermal expansion difference between the ceramic and the wiring board is large and the stress imposed on solder becomes very large. Thus, a crack occurs in the solder in a short time in an environment in which the temperature difference is severe, and a break may occur between the LED lamp and the wiring board. Particularly, when a metal base with high thermal conductivity is used as a radiation measure against heat generated during the LED chip driving, the above mentioned stress problem becomes apparent due to enlarged thermal expansion difference. For such a reason, it is difficult to make full use of the high quality of a ceramic package.

It is therefore an object of the invention to provide an LED lamp module for improving the joint property of an LED lamp using a ceramic package and a wiring board and enhancing the radiation performance of the LED lamp.

SUMMARY OF THE INVENTION

The above-mentioned problem is solved by an LED lamp module including a metal base, a flexible board mounted on the metal base and having a through hole, a surface mounted type LED lamp including a ceramic package having a projection portion on a back of the ceramic package, a LED chip mounted on the ceramic package, and a light output surface. The projection portion is thermally connected with the metal base through the through hole, and the LED lamp is electrically connected with the flexible board through an electric conductive member at a portion other than where the ceramic package and the metal base come into contact.

The LED lamp module also includes a cover covering a part of the LED lamp other than the light output surface and the flexible board and pressing the LED lamp.

Preferably, the cover also presses the flexible board.

Preferably, the cover is engaged with the metal base and presses a portion of the LED lamp other than the light output surface.

Preferably, the cover includes a projection and the projection presses the flexible board.

Preferably, the cover has a cut-out portion so as to expose an external connection part of the flexible board.

In the LED lamp module described above, the LED lamp is mounted on the flexible board, so that the stress caused by the thermal expansion coefficient difference between the ceramic package and the metal base is absorbed. Thus, the stress imposed on the conductive member decreases drastically. The LED lamp is thermally connected to the metal base and further is pressed against the metal base by the cover, so that the heat generated from the LED lamp can be sufficiently dissipated. Accordingly, the highly reliable and high-quality LED lamp module can be provided. Since the LED lamp is pressed using the screws, the pressing degree can be adjusted easily, so that the flexibility of the design of the LED lamp module increases. Further, the LED lamp is pressed and the projections formed on the cover also press the flexible board, so that a position shift of the flexible board can be prevented.

According to the manufacturing method of the light emitting device of the invention, the joint property of the LED lamp using the ceramic package and a wiring board can be improved.

BRIEF DESCRIPTION OF DRAWINGS

In the accompanying drawings:

FIG. 1a is a side perspective view of the LED lamp module and FIG. 1B is a top view of the LED lamp module;

FIG. 4A is a top view of a metal base; FIG. 4B is a top view of the flexible board and the LED lamp and a Zener diode mounted on the flexible board; and FIG. 4C is a top view of a cover.

DETAIL DESCRIPTION OF THE PREFERRED EMBODIMENTS

Figure 1A:
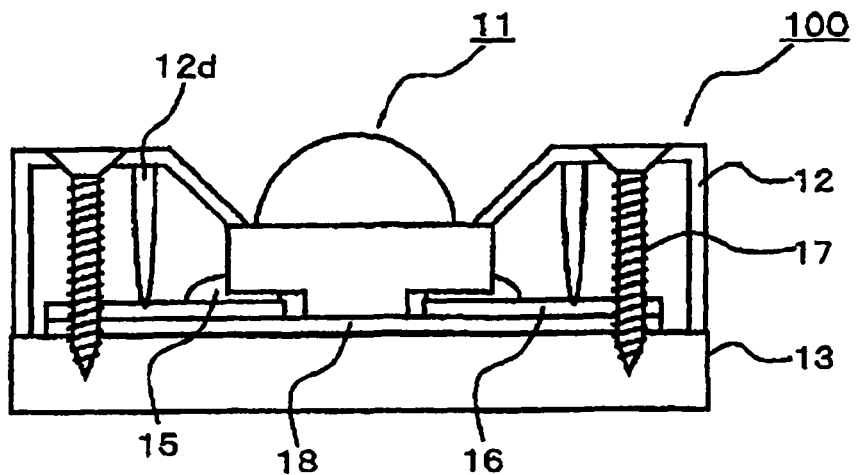
FIGS. 1A and 1B are schematic representations of an LED lamp module of an embodiment of the invention.
Figure 1B:
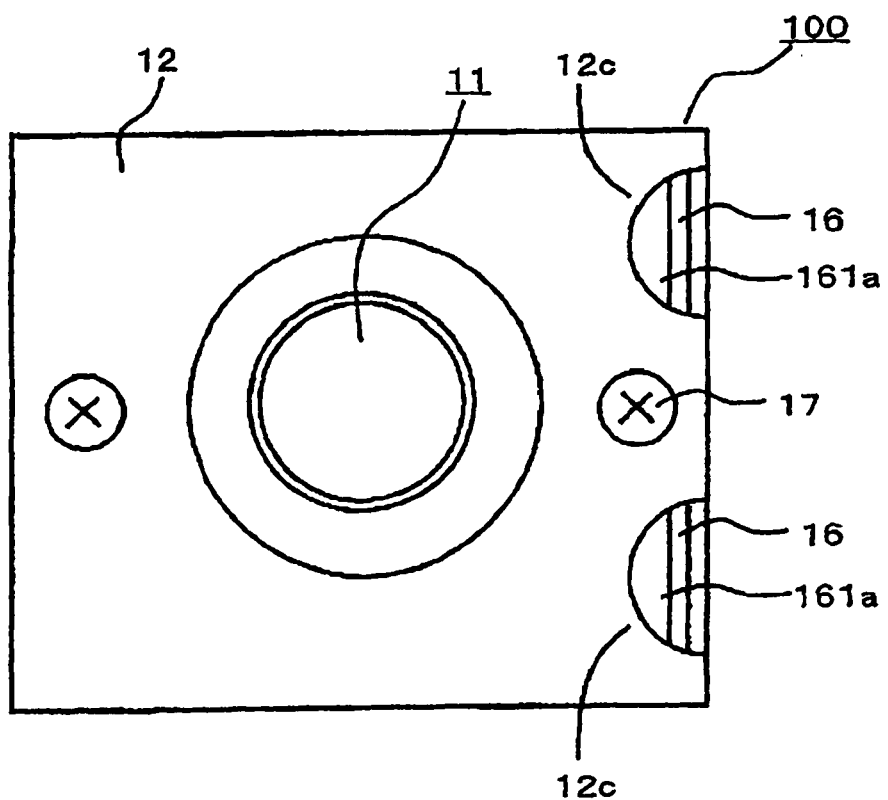

FIGS. 1A and 1B are schematic representations of an LED lamp module 100 of an embodiment of the invention; FIG. 1A is a side perspective view of the LED lamp module and FIG. 1B is a top view of the LED lamp module.

The LED lamp module shown in FIG. 1A includes a metal base 13, a flexible board 16 mounted on the surface of the metal base 13, an LED lamp 11 electrically connected to the flexible board 16 through a conductive member 15, and a cover 12 for covering the flexible board 16 and a portion of the LED lamp 11 other than the light output surface thereof and engaged with the metal base 13 by screws 17.

Figure 2:
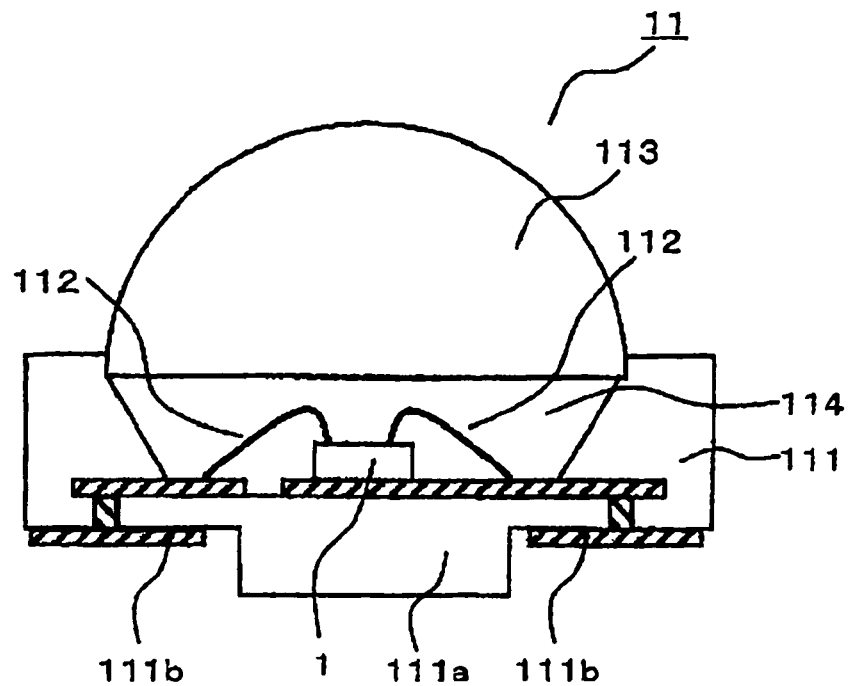
FIG. 2 is a sectional view of an LED lamp using the embodiment of the invention.

As shown in FIG. 2, the LED lamp 11 has a ceramic package having a projection portion 111a on a back, a concave hollow 114 on a surface and a multi layer wiring 111b which is exposed to a step portion around the projection portion 111a and a bottom face of the concaved hollow 114 and electrically connected each other, LED chip 1 mounted on the multi layer wiring exposed to the bottom face, wires 112 electrically connecting the LED chip and each of the multi layer wirings 111b and a lens 113 as a light output surface fixed on the top of the hollow part.

The ceramic package 111 is made of $Al_2O_3$ (alumina), AlN (aluminum nitride), or the like. The ceramic package 111 is provided by stacking a green sheet of a predetermined shape and then sintering. The hollow 114 is formed with a slope extended from the bottom face of the hollow to the surface of the ceramic package 111. The multilayer wiring 111b is made up of W (tungsten), Ni (nickel), and Au (gold) or Ag (silver) in order from the bottom layer to the upper layer, and each portion exposed to the back of the ceramic package is provided as an external connection terminal.

The LED chip 1 is formed by depositing a buffer layer made of a gallium nitride based compound semiconductor ($Al_{1-X-Y}In_XGa_YN$ where $0 \leq X \leq 1$, $0 \leq Y \leq 1$, $0 \leq X+Y \leq 1$), an n-type layer, a light emitting layer, and a p-type layer on a crystal substrate of sapphire ($Al_2O_3$), spinel ($MgAl_2O_4$), gallium nitride (GaN), silicon carbide (SiC), gallium oxide ($Ga_2O_3$), or the like, in order from the crystal substrate side according to metalorganic vapor phase epitaxy (MOVPE) although not shown in the figure. Etching is performed from a partial area on the p-type layer side for exposing a part of the n-type layer. A p electrode and an n electrode are formed on the surfaces of the p-type layer and the n-type layer respectively and are electrically connected to the multilayer wiring 111b through wires. When power is supplied through the multilayer wiring 111b, blue light is emitted from the light emitting layer. In FIG. 2, the LED chip is mounted face up, but may be mounted face down.

The lens is formed of a resin material of an acrylic resin, or the like. A glass material may be used in place of the resin material. A photo-transformation function may be added by adding phosphor particles in the lens. If a yellow phosphor such as a YAG (Yttrium Aluminum Garnet) based phosphor for emitting yellow light as wavelength conversion light is added as the phosphor particles, with the blue light emitted from the LED chip 1 as excitation light, the blue light and the yellow light can be mixed to provide white light. A light filter function for taking out only specific wavelength light may be added by adding a pigment.

The hollow part 114 is filled with resin of epoxy resin, silicone, fluorocarbon resin, or the like. A photo-transformation function may be added by adding phosphor particles into the resin. The hollow part 114 may be filled with inert gas of $N_2$ (nitrogen), rare gas, or the like, in place of the resin material or may be filled with an insulating liquid of silicon oil, or the like. In this case, to prevent leakage of gas or liquid, preferably hermetic sealing is applied.

Figure 3:
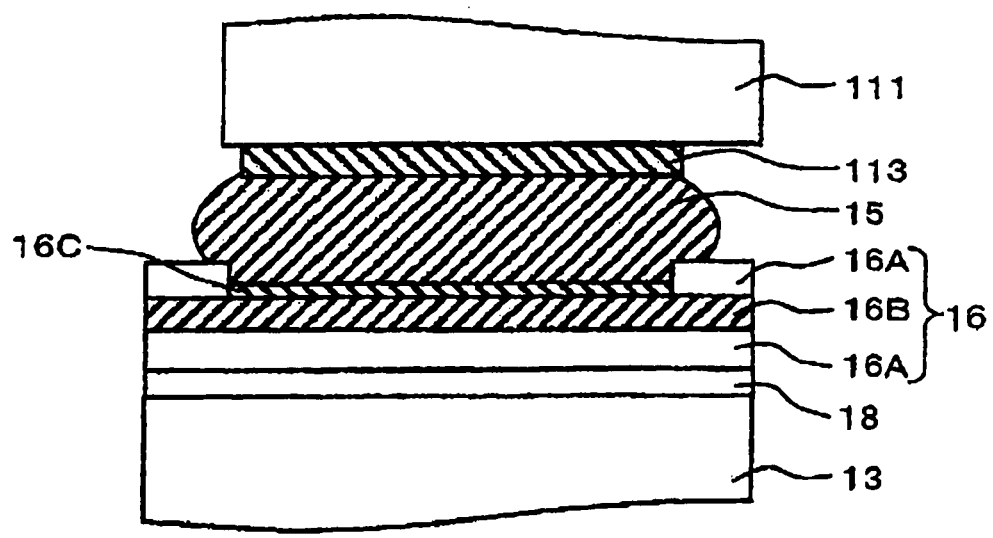
FIG. 3 is an enlarged sectional view of the joint part of the LED lamp and a flexible board in the embodiment of the invention.

The flexible board 16 has a structure wherein metal foil 16B of Cu (copper), or the like, is sandwiched between flexible films 16A of polyimide, a liquid crystal polymer, a crystalline polymer, or the like, as shown in FIG. 3. In a connection part with the outside, the flexible film 16A is removed and to improve the joint property with a conductive member of solder, etc, a metalized part of Ni/Au, or the like, is formed in order from the metal foil 16B. As shown in FIG. 4B, wiring 161 including external connection parts 161a, LED lamp mounting parts 161b, and a Zener diode mounting part (the part indicated by the arrow from 21 in FIG. 4B) is formed on the surface. Further, a through hole 12b for bringing the projection portion 111a of the LED lamp 11 into contact with the metal base 13 is formed between the LED lamp mounting parts 161b. Accordingly, the heat dissipation performance of the LED lamp 11 can be enhanced.

As a conductive material for mounting the LED lamp 11 and a Zener diode 21 on the flexible board 16, metal paste of metal, such as Ag, contained in resin, soft metal, such as Au, and solder such as AuSn, AuGe, AuSi can be used. Among them, solder is preferable because of the facile joint step thereof.

A heat dissipation member 18 is made of a double-side sheet containing silicone grease, metal, or the like, or the like.

The metal base 13 is made of metal of Al (aluminum), Cu (copper), or the like. When reducing the weight of the LED lamp module 100, Al is preferable. In case improving thermal conductivity, Cu is preferable.

The cover 12 is formed of a resin material of an ABS (Acrylonitrile Butadien Styrene) resin, an amide-based resin, a liquid crystal polymer, or the like, containing a white pigment of $TiO_2$ (titanium dioxide), $BaSO_4$ (barium sulfate), or the like. As shown in FIGS. 1B and 4C, the cover 12 has a dent formed with a slope spread in the top face direction in the center of the top face of the cover 12 and a through hole is provided so as not to cover the light output face of the LED lamp. The dent plays a role in pressing the LED lamp in the bottom part and improving the radiation property of the LED lamp and also in performing distribution control of light emitted from the LED lamp on the slope. The cover is formed on one side with two cut-out portions 12c so as not to cover the external connection part of the flexible board to electrically connect the LED lamp module 100 to the outside. Further, as shown in FIG. 1A, projections 12d each to press the proximity of the LED lamp mounting part are formed to prevent a position shift of the flexibility board. To improve the reflectivity of the slope, preferably a metal reflecting film of Al (aluminum), or the like, is formed on the outer face of the slope by plating. The metal reflecting film may be formed on the whole top face of the outer face of the cover 12 or the whole surface of the outer face.

Figure 4A:
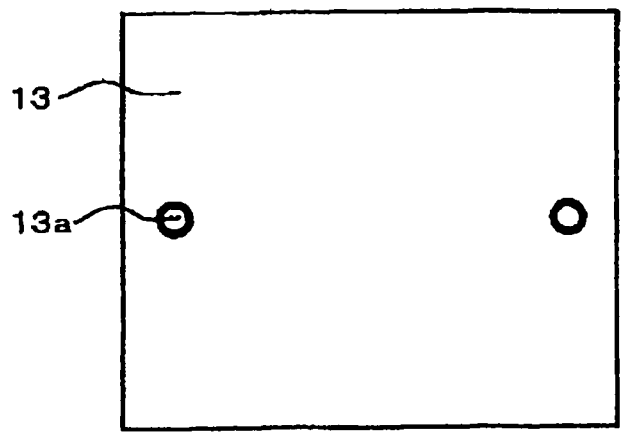
FIGS. 4A, 4B and 4C are top views of components of the LED lamp module in the embodiment of the invention.
Figure 4B:
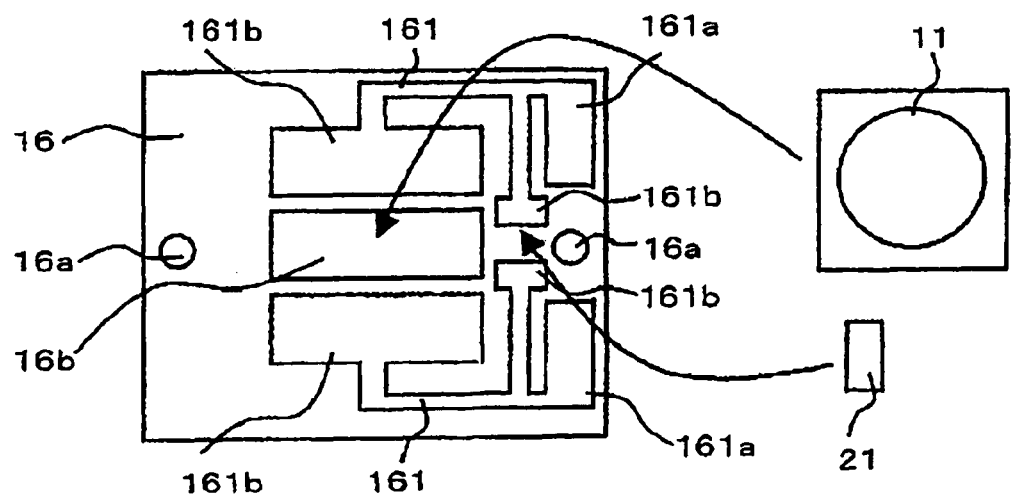
Figure 4C:
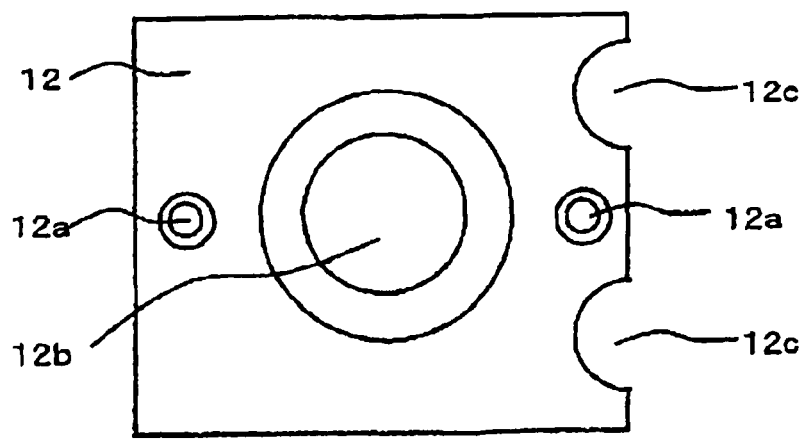

In the LED lamp module 100, to engage the cover 12 with the metal base 13 by the screws 17, the cover 12, the flexible board 16, and the metal base 13 are formed with screw through holes 12a and 16a and screw holes 13a, as shown in FIGS. 4A to 4C.

The cover 12 and the metal base 13 can be engaged using rivets, bolt nuts, or the like, in place of the screws 17; however, preferably they are engaged using screws capable of easily adjusting the engaged state.

A manufacturing method of the LED lamp module will be discussed below with reference to FIG. 4:

To begin with, the metal base 13 shown in FIG. 4A is provided and the flexible board 16 shown in FIG. 4B is adhered by the thermal dissipation member 18. Next, the LED lamp 11 and the Zener diode 21 are mounted on the LED lamp mounting parts 161b and the Zener diode mounting part 161c of the flexible board 16 through solder and are passed through a reflow furnace, whereby they are fixed to the flexible board 16. At this time, the projection portion 111a of the LED lamp 11 is electrically connected to the flexible board 16 while it is thermally joined to the radiation member. Last, as shown in FIG. 1B, the external connection parts 161a of the flexible board 16 and the cut-out portions 12c of the cover 12 shown in FIG. 4B are opposed to each other and the cover 12 and the metal base 13 are fixed by the screws 17. Manufacturing the LED lamp module 100 is now complete.

The flexible board 16 may be adhered to the metal base 13 after the LED lamp 11 and the Zener diode 21 are fixed to the LED lamp mounting parts 161b and the Zener diode mounting part 161c of the flexible board 16. In this case, the flexible board 16 need not necessarily be adhered to the metal base 13.

In the LED lamp module of the embodiment of the invention, the LED lamp is mounted on the flexible board, so that the stress caused by the thermal expansion coefficient difference between the ceramic package and the metal base is absorbed. Thus, the stress imposed on the conductive member decreases drastically. The LED lamp is thermally connected to the metal base and further is pressed against the metal base by the cover, so that the heat generated from the LED lamp can be sufficiently dissipated. Accordingly, the highly reliable and high-quality LED lamp module can be provided. Since the LED lamp is pressed using the screws, the pressing degree can be adjusted easily, so that the flexibility of the design of the LED lamp module increases. Further, the LED lamp is pressed and the projections formed on the cover also press the flexible board, so that a position shift of the flexible board can be prevented.

The invention is not limited to the specific embodiment described above.

In the embodiment, the combination of the LED chip for emitting blue light and the yellow transformation phosphor has been described. However, the invention is not limited to the combination and can also be applied to an LED lamp of any other combination such as a combination of an LED for emitting blue light and a green light emitting phosphor and a red light emitting phosphor or a combination of an LED for emitting ultraviolet light and a blue light emitting phosphor, a green light emitting phosphor, and a red light emitting phosphor.

In the invention, the GaN-based semiconductor light emitting element has been described, but an InP-based or AlGaAs-based semiconductor light emitting element for emitting green light, yellow light, red light may be used.

Further, in the embodiment described above, the LED lamp module mounting one LED lamp is formed, but the invention can also be applied to an LED lamp module mounting two or more LED lamps.

What is claimed is:

1. A LED lamp module comprising:
  a metal base;
  a flexible board mounted on the metal base and including a through hole;
  a surface mounted type LED lamp including a ceramic package formed such that a projection portion of the ceramic package extends from a back of the ceramic package, a LED chip mounted on the ceramic package, and a light output surface, wherein a portion of an end face of the projection portion of the ceramic package is thermally connected with the metal base through the through hole such that the flexible board is not disposed between the portion of the end face of the projection portion and the metal base, and the LED lamp is electrically connected with the flexible board through an electric conductive member at a portion other than where the ceramic package and the metal base come into contact;
  a cover covering a part of the LED lamp other than the light output surface and the flexible board, wherein the cover contacts an upper surface of the ceramic package; and
  an engaging member connecting the cover, the LED lamp and the metal base such that the cover is pressed on the upper surface of the ceramic package of the LED lamp, wherein the flexible board is disposed between a portion, of the metal base and the cover such that the cover contacts the flexible board.

2. The LED lamp module according to claim 1, wherein the cover presses the LED lamp.

3. The LED lamp module according to claim 2, wherein the cover presses the flexible board.

4. The LED lamp module according to claim 3, wherein the cover is engaged with the metal base and presses a portion of the LED lamp other than the light output surface.

5. The LED lamp module according to claim 4, wherein the cover includes a projection and the projection presses the flexible board.

6. The LED lamp module according to claim 5, wherein the cover includes a cut-out portion so as to expose an external connection part of the flexible board.

7. The LED lamp module according to claim 1, wherein the cover includes a hole through which the light output surface of the LED lamp passes through the cover.

8. The LED lamp module according to claim 1, wherein the projection portion comprises a ceramic which comprises a same material as a ceramic of the ceramic package.

9. The LED lamp module according to claim 1, wherein the electric conductive member includes a multi-layer wiring, the multi-layer wiring comprising an upper layer connected to the LED chip and a lower layer connected to the upper layer through the back of the ceramic package.

10. The LED lamp module according to claim 1, wherein the flexible board comprises flexible films and a metal foil sandwiched between the flexible films.

11. The LED lamp module according to claim 1, wherein the cover comprises a resin material.

12. The LED lamp module according to claim 1, wherein the cover includes a through hole disposed on the light output surface.

13. The LED lamp module according to claim 1, wherein the engaging member comprises a screw.

14. The LED lamp module according to claim 1, wherein the engaging member comprises a member capable of being adjusted so as to control the pressing force.

15. The LED lamp module according to claim 5, wherein a distal end of the projection contacts the flexible board.

16. The LED lamp module according to claim 5, wherein the projection is disposed so as sandwich the flexible board between the projection and the metal base.

17. The LED lamp module according to claim 1, wherein the cover includes a projection extending from the cover towards the flexible board, such that the projection contacts the flexible board.

18. The LED lamp module according to claim 1, wherein the projection portion of the ceramic package extends from a side of the ceramic package opposite the LED chip.

19. The LED lamp module according to claim 1, wherein the flexible board comprises a metal foil sandwiched between flexible films of polymer.

20. The LED lamp module according to claim 1, wherein the projection portion comprises a portion of the ceramic package extending from a side of the ceramic package opposite the LED chip.

* * * * *